(12) United States Patent
Mihara

(10) Patent No.: US 6,467,674 B1
(45) Date of Patent: Oct. 22, 2002

(54) METHOD OF MANUFACTURING SEMICONDUCTOR DEVICE HAVING SEALING FILM ON ITS SURFACE

(75) Inventor: Ichiro Mihara, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/722,943

(22) Filed: Nov. 27, 2000

(30) Foreign Application Priority Data

Dec. 9, 1999 (JP) ............................................ 11-350021

(51) Int. Cl.⁷ .................... H01L 21/4763; H01L 21/302
(52) U.S. Cl. ............... 228/164; 228/180.22; 228/179.1; 438/619; 438/690; 438/692
(58) Field of Search .......................... 228/164, 180.22, 228/179.1, 246, 254, 256; 438/690–692, 613, 619; 257/743, 750

(56) References Cited

U.S. PATENT DOCUMENTS

| | | | | |
|---|---|---|---|---|
| 5,656,863 A | * | 8/1997 | Yasunaga et al. | 257/778 |
| 5,811,330 A | * | 9/1998 | Kalnitsky | 438/238 |
| 5,950,102 A | * | 9/1999 | Lee | 438/619 |
| 6,140,155 A | * | 10/2000 | Mihara et al. | 438/124 |
| 6,147,001 A | * | 11/2000 | Kimura et al. | 438/692 |
| 6,284,658 B1 | * | 9/2001 | Kato et al. | 438/690 |
| 6,319,851 B1 | * | 11/2001 | Mihara et al. | 438/778 |
| 6,373,544 B1 | * | 4/2002 | Hirabayashi | 349/138 |
| 6,375,064 B1 | * | 4/2002 | Edasawa et al. | 228/179.1 |
| 2001/0004133 A1 | * | 6/2001 | Ihara | 257/750 |

FOREIGN PATENT DOCUMENTS

| | | | | | |
|---|---|---|---|---|---|
| JP | 3-21021 A | * | 1/1991 | | 438/124 |
| JP | 8-64725 | | 3/1996 | | |
| JP | 08-64725 A | * | 3/1996 | | 438/124 |
| JP | 2000-223519 A | * | 8/2000 | | 438/124 |
| JP | 2000-306949 | | * 11/2000 | | 438/124 |

* cited by examiner

*Primary Examiner*—Tom Dunn
*Assistant Examiner*—L. Edmondson
(74) *Attorney, Agent, or Firm*—Frishauf, Holtz, Goodman & Chick, P.C.

(57) ABSTRACT

A sealing film is formed on a semiconductor substrate on which a number of columnar electrodes are formed, and then the upper surface of the sealing film is polished to expose the upper surfaces of the columnar electrodes made of a soft metal. During the polishing, laterally broadened edges are generated on the upper sides of the columnar electrodes. Then, the upper surfaces of the columnar electrodes, including the laterally broadened edges, are etched so as to remove the edges. In this manner, the shape of the upper surfaces of the columnar electrodes can be formed as initially designed, and therefore the bonding strengths can be made uniform. Thus, the reliability of the device can be improved.

12 Claims, 5 Drawing Sheets

METHOD OF MANUFACTURING SEMICONDUCTOR DEVICE HAVING SEALING FILM ON ITS SURFACE

CROSS-REFERENCE TO RELATED APPLICATIONS

This application is based upon and claims the benefit of priority from the prior Japanese Patent Application No. 11-350021, filed Dec. 9, 1999, the entire contents of which are incorporated herein by reference.

BACKGROUND OF THE INVENTION

The present invention relates to a method of manufacturing a semiconductor device having a plurality of columnar electrodes and a sealing film filled between these columnar electrodes, on its surface.

A semiconductor device such as of a type called CSP (Chip Size Package) is typically manufactured as shown FIGS. 3A to 3C. A semiconductor substrate 1 in the form of wafer, which is made of silicon or the like, having a plurality of columnar electrodes 2 made of copper or the like, made on its upper surface thereof, is prepared, and a sealing film 3 made of an epoxy-based resin is formed thereon such as to cover the surrounding area of the columnar electrodes 2 on the upper surface of the substrate by a molding method or spin-coat method, or the like, as shown in FIG. 3A. Subsequently, the upper surface of the sealing film 3 is polished so as to expose the upper surface of each of the columnar electrodes 2 as shown in FIG. 3B. Then, a surface treatment layer 4, which serves as an oxidization preventer, is formed on the upper surface of each columnar electrode 2 by non-electrolytic plating as shown in FIG. 3C. Lastly, the semiconductor substrate 1 is diced, and thus individual semiconductor devices are obtained.

FIG. 4 shows a cross section of an example of a state in which a semiconductor device 5 obtained in the above-described manner, is mounted on a circuit substrate 6. In this example, the surface treatment layer 4 provided on the lower surface of each columnar electrode 2 of the semiconductor device 5 is connected to a connection terminal 7 set at a predetermined location on the upper surface of the circuit substrate 6 via solder (paste) 8 provided in advance on the connection terminal 7 by a screen printing method.

In the conventional semiconductor device manufacturing method described above, the columnar electrodes 2 undesirably differ in size from one to another, and therefore in environmental tests such as temperature cycle and the like, the bonding strength cannot be made uniform among the columnar electrodes 2 connected via bonding to the respective connection terminals 7. Consequently, the conventional method is not very much reliable. According to the analysis of the factor for such an unreliability, it has been confirmed that it is due to the occurrence of an uneven protrusion or laterally broadened edge 2a on the upper side of each of the columnar electrodes 2 as indicated in, for example, FIGS. 5A and 5B when the upper surface of the sealing film 3 is polished to expose the upper surfaces of the columnar electrodes 2. When such a protrusion 2a is created on the upper side of each columnar electrode 2 and thus the shape of the upper surface of each electrode is deformed, the flat shape of the surface treatment layer 4 formed thereon is also affected and deformed. As a result, the shape and area of the vicinity of the bonding section to the connection terminal 7 of the circuit substrate 6 vary from one case to another, which creates a difference in the bonding strength. Therefore, the reliability against changes in environment of the devices manufactured by the method is lowered.

BRIEF SUMMARY OF THE INVENTION

The object of the present invention is to form the upper surfaces of columnar electrodes as initially designed, thereby achieving a uniform bonding strength among the electrodes and improving the reliability of the product.

According to the present invention, there is provided a method of manufacturing a semiconductor device, comprising the steps of:

preparing a semiconductor substrate on one surface of which a plurality of columnar electrodes are formed;

forming a sealing film on the one surface of the semiconductor substrate for covering sections between the columnar electrodes and the columnar electrodes themselves; and polishing an upper surface of the sealing film until upper surfaces of the columnar electrodes are exposed; and removing laterally broadened edges formed on the upper sides of the columnar electrodes which have been formed by the polishing by etching the upper surfaces of the columnar electrodes.

According to the present invention, the laterally broadened edges or protrusions formed on the upper sides of the columnar electrodes are removed by etching, and therefore the shape of the upper surface of each columnar electrode can be formed as initially designed, thereby making it possible to achieve unifying the bonding strengths in the electrodes and improve the reliability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
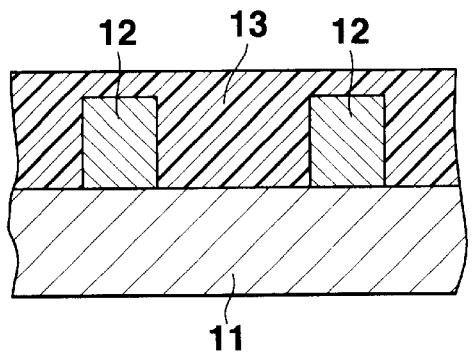
FIGS. 1A to 1D are enlarged cross sections of main portions of a semiconductor device, designed to illustrate a method of manufacturing the semiconductor device having a sealing film according to an embodiment of the present invention.

FIGS. 1A to 1D are enlarged cross sections of main portions of a semiconductor device, designed to illustrate manufacturing steps for a semiconductor device having a sealing film, according to the present invention. With reference to these figures in order, the method of manufacturing a semiconductor device in this embodiment will now be described. First, as shown in FIG. 1A, a semiconductor substrate 11 in the form of water made of semiconductor, on an upper surface of which a plurality of columnar electrodes 12 made of a soft metal such as copper, aluminum, tin or solder are formed at predetermined intervals, is prepared. It is preferable, although it is not essential that each columnar electrode 12 should have a circular cross section and a height of about 100 $\mu$m to 200 $\mu$m. On one surface of the semiconductor device 11, a sealing film 13 made of synthetic resin such as epoxy-based resin is formed such as to cover sections between the columnar electrodes 12 and the upper surface thereof by a molding method, spin-coat method, a printing method or the like.

Figure 1B:
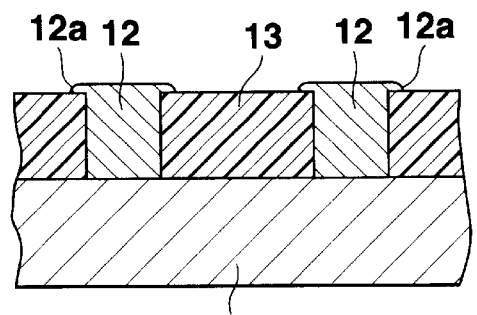
Figure 1C:
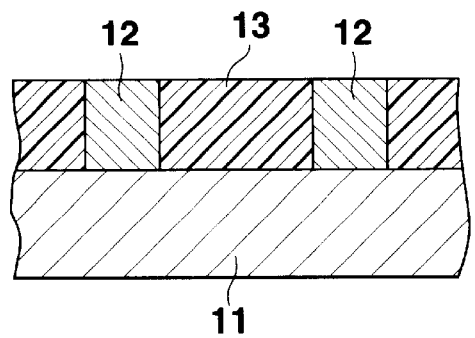

Next, the upper surface of the sealing film 13 is polished and the upper surfaces of the columnar electrodes 12 are accordingly exposed as can be seen in FIG. 1B. In general, the polishing is carried out with a grind stone having an appropriate roughness, and appropriate examples which can polish both of the sealing film 13 and the columnar electrodes 12 are those having about #600 to #2000. In order to enhance the efficiency of the polishing, it is possible that first, grinding is carried out with a grind stone of about #600 and then polishing is performed with a grind stone of about #1200 to #2000. However, with any types of the conventional methods are used, an uneven protrusion or laterally broaden edge 12$a$ (extrusion to side) is formed on the upper side of each columnar electrode 12 since the columnar electrode 12 is made of a soft metal such as copper. Here, even if a finer grind stone is used for the polishing, it will polish the sealing film inevitably at the same time; therefore clogging easily occurs and accordingly such a protrusion 12$a$ cannot be removed. In order to solve this drawback, in the present invention, after the polishing, the upper surfaces of the columnar electrodes 12 including protrusions 12$a$ are subjected to degreasing treatment using a degreasing agent, and then the upper surfaces of the columnar electrodes 12 including protrusions 12$a$ are etched so as to remove the protrusions 12$a$ as can be seen in FIG. 1C. The etching method used here may be of a dry or wet-type. However, in this etching step, a mask is not used, and therefore the wet etching is more efficient. In the case where the columnar electrodes 12 are made of copper, examples of the etchant are sulfuric acid-hydrogen peroxide-based agent, ammonium persulfate-based agent and cupric chloride-based agent. It suffices if the etching is carried out to achieve such a state that the upper surfaces of the columnar electrodes 12 are equally leveled with the sealing film 13, or the upper surface of the sealing film 13 is depressed by 1 to 2 $\mu$m, and thus the protrusions 12$a$ are completely disappeared.

Figure 1D:
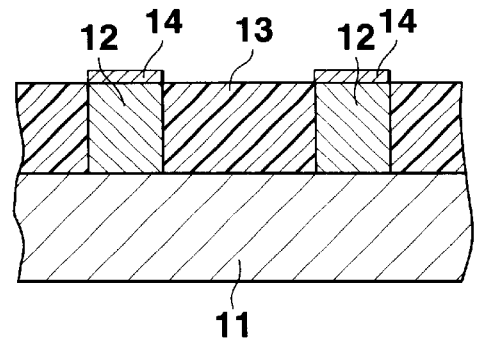

Next, as shown in FIG. 1D, non-electrolytic plating of nickel/gold, nickel/solder, nickel/tin or the like is carried out so as to form a surface treatment layer 14 on the upper surface of the columnar electrode 12 for prevention of oxidization. After that, the semiconductor substrate 11 is diced into individual semiconductor devices.

Figure 4:
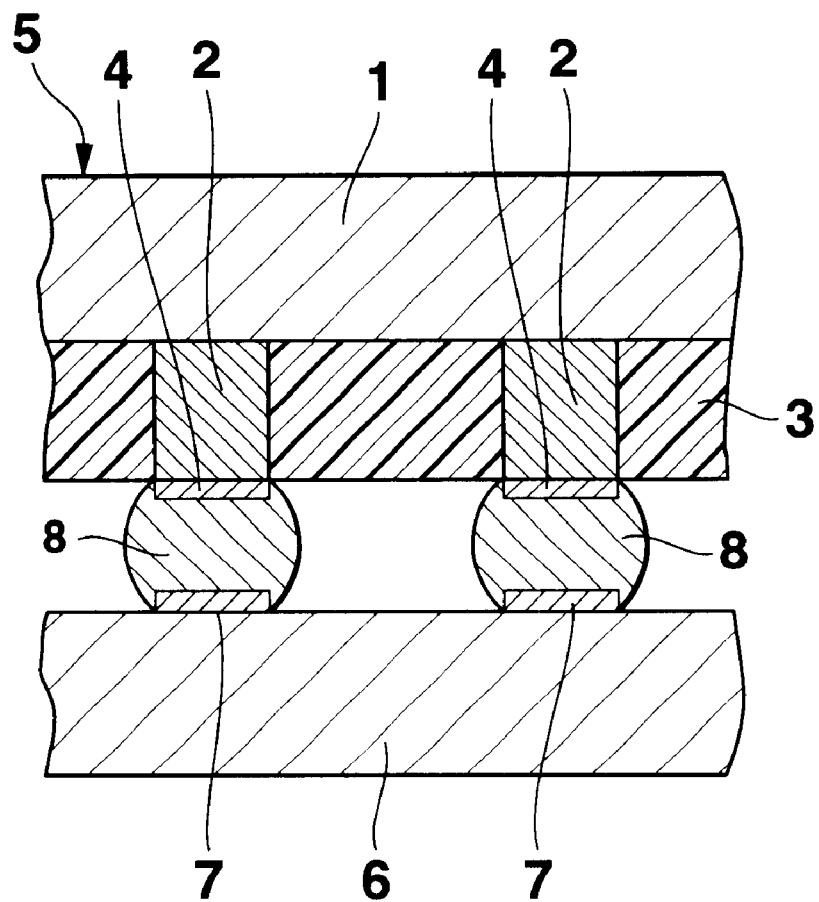
FIG. 4 is an enlarged cross section of a main portion of a semiconductor device in such a state that a conventional semiconductor device is mounted on a circuit board.
Figure 5A:
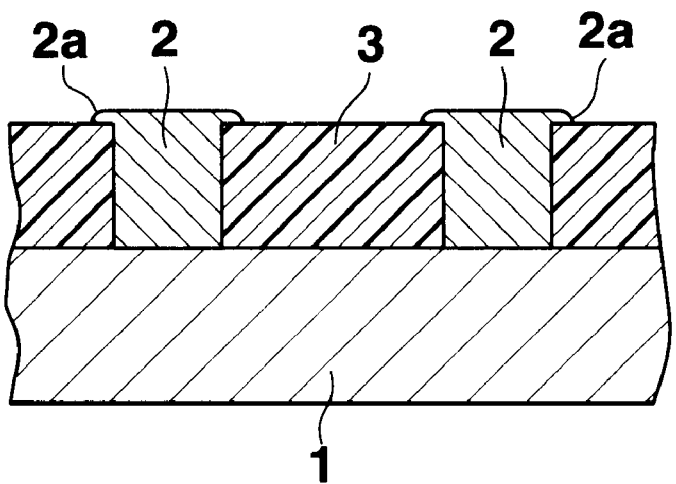
FIG. 5A is an enlarged cross section designed to illustrate a drawback of the conventional method of manufacturing a semiconductor device.
Figure 5B:
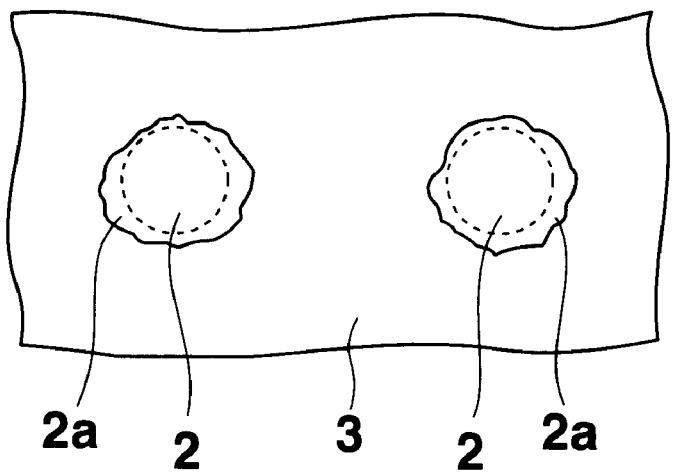
FIG. 5B is a plan view of what is shown in FIG. 5A.

In connection with thus obtained semiconductor devices, since the protrusion 12$a$ formed on the upper surface of the columnar electrode 12 is removed by etching, the shape of the upper surface of each columnar electrode 12 can be made as initially designed (for example, circular), and therefore the plane shape of the surface treatment layer 14 formed further thereon can be made as initially designed. Therefore, as in the case shown in FIG. 4, when such a semiconductor device is mounted on a circuit board, the shapes or areas of the bonding sections with respect to the connection terminals of the circuit substrate can be made uniform, and accordingly the bonding strengths of these bonding sections can be made uniform. Therefore, the reliability of the device against change in environment can be improved.

Figure 2A:
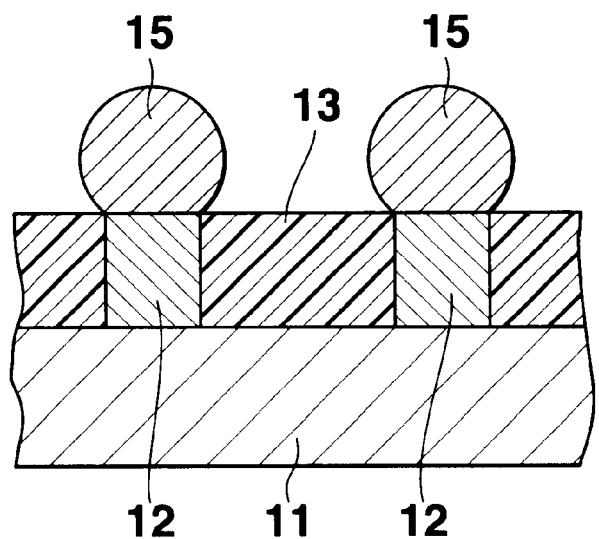
FIG. 2A is an enlarged cross section of a main portion of a semiconductor device, designed to illustrate another embodiment of a step after the step shown in FIG. 1C.
Figure 2B:
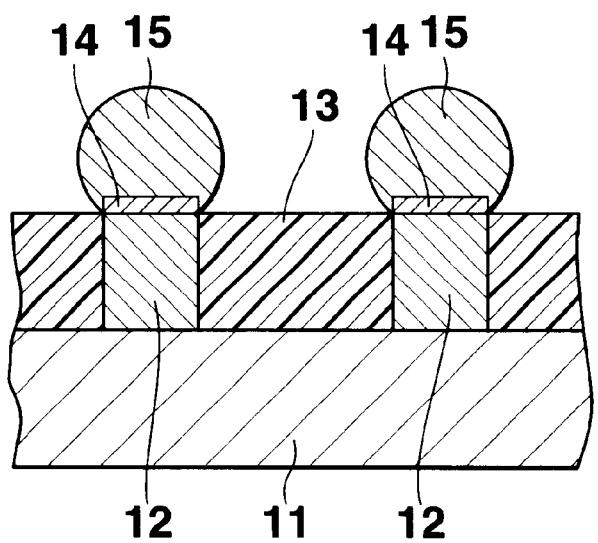
FIG. 2B is an enlarged cross section of a main portion of a semiconductor device, designed to illustrate another embodiment of a step after the step shown in FIG. 1D.
Figure 3A:
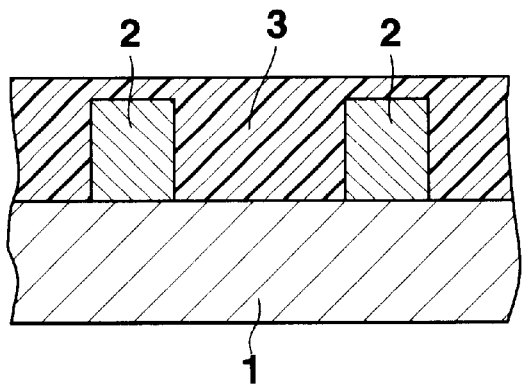
FIGS. 3A to 3C are enlarged cross sections of main portions of a semiconductor device, designed to illustrate an example of the method of manufacturing the semiconductor device having a sealing film according to a conventional technique.
Figure 3B:
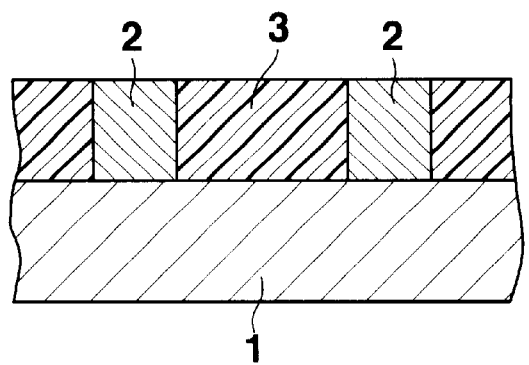
Figure 3C:
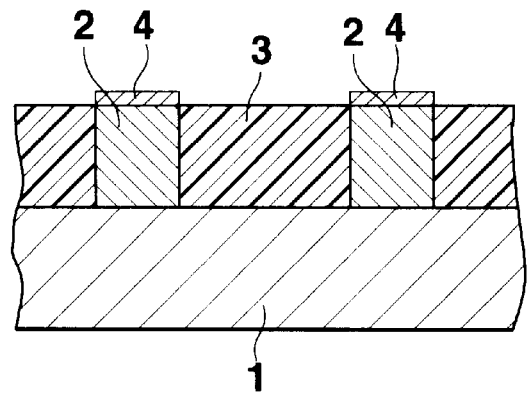

Alternatively, it is possible that, after the manufacturing step shown in FIG. 1C, a solder ball 15 is formed on the upper surface of each columnar electrode 12 as shown in FIG. 2A by printing solder paste or mounting the solder ball followed by re-flow. It is also possible that, after the manufacturing step shown in FIG. 1D, a solder ball 15 is formed on the upper surface of the surface treatment layer 14 as shown in FIG. 2B by printing solder paste or mounting the solder ball followed by re-flow. With these solder ball forming techniques, the dispersion of the heights of the solder balls 15 can lessened. After that the solder balls 15 of the semiconductor device, shown in the above FIGS. 2A and 2B are positioned on the terminals of the circuit board, and then bonded thereto.

Here, it is possible that the solder balls 15 are formed in advance on the circuit board to which they are to be bonded, and then the columnar electrodes 12 of the semiconductor device of the present invention are mounted on the solder balls formed on the circuit board, to be then bonded thereon. In the present invention, in both cases where solder balls 15 are formed directly on columnar electrodes of a semiconductor device and where columnar electrodes are bonded to solder balls formed on a circuit board, it is expressed that the solder balls are mounted on the columnar electrodes.

As described above, according to the present invention, protrusions formed on the upper sides of columnar electrodes by polishing are removed by etching and therefore the shape of the upper surfaces of the columnar electrodes can be made as initially designed. Consequently, when the device is mounted on a circuit board, the shapes and areas of bonding sections to connection terminals of the circuit board can be made uniform, and thus the bonding strengths can be made uniform. For this reason, the reliability of the device against changes in environment can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

preparing a semiconductor substrate on one side of which a plurality of columnar electrodes are formed;

forming a sealing film on said one side of the semiconductor substrate to cover the columnar electrodes and sections between the columnar electrodes;

polishing an upper surface of the sealing film until upper surfaces of the columnar electrodes are exposed; and removing laterally broadened edges extended from upper sides of the columnar electrodes which result from the polishing, by removing the upper surfaces of the columnar electrodes.

2. A semiconductor device manufacturing method according to claim 1, wherein the columnar electrodes comprise at least one of copper, aluminum, tin and solder.

3. A semiconductor device manufacturing method according to claim 1, wherein the polishing of the upper surface of the sealing film is carried out with use of a grind stone.

4. A semiconductor device manufacturing method according to claim 3, wherein the polishing is carried out first with use of a coarse grind stone, and then with a finer grind stone.

5. A semiconductor device manufacturing method according to claim 1, wherein the laterally broadened edges extended from the upper sides of the columnar electrodes are removed by wet-etching.

6. A semiconductor device manufacturing method according to claim 1, wherein the laterally broadened edges extended from the upper sides of the columnar electrodes are removed by dry-etching.

7. A semiconductor device manufacturing method according to claim 1, wherein the laterally broadened edges extended from the upper sides of the columnar electrodes are removed by etching, after degreasing the upper surfaces of the columnar electrodes.

8. A semiconductor device manufacturing method according to claim 1, wherein each of the columnar electrodes has a substantially circular cross section.

9. A semiconductor device manufacturing method according to claim 1, wherein after removing the laterally broadened edges extended from the upper sides of the columnar electrodes, solder balls are mounted on exposed surfaces of the columnar electrodes.

10. A semiconductor device manufacturing method according to claim 1, further comprising forming surface treatment layers on exposed surfaces of the columnar electrodes after removing the laterally broadened edges extended from the upper sides of the columnar electrodes.

11. A semiconductor device manufacturing method according to claim 10, wherein the surface treatment layers are formed by non-electrolytic plating.

12. A semiconductor device manufacturing method according to claim 10, wherein solder balls are mounted on the surface treatment layers formed on the columnar electrodes.

* * * * *